United States Patent
Bae et al.

(10) Patent No.: US 9,412,716 B2
(45) Date of Patent: Aug. 9, 2016

(54) SEMICONDUCTOR PACKAGE AND METHOD FOR MANUFACTURING THE SAME

(71) Applicant: SK hynix Inc., Icheon-si (KR)

(72) Inventors: Jin Ho Bae, Suwon-si (KR); Qwan Ho Chung, Seoul (KR); Seong Kweon Ha, Yangju-si (KR); Jong Hyun Kim, Seoul (KR); Bok Gyu Min, Incheon-si (KR); Jae Won Shin, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/284,637

(22) Filed: May 22, 2014

(65) Prior Publication Data

US 2015/0123283 A1 May 7, 2015

(30) Foreign Application Priority Data

Nov. 1, 2013 (KR) .................. 10-2013-0132044

(51) Int. Cl.
| | |
|---|---|
| *H01L 23/34* | (2006.01) |
| *H01L 23/00* | (2006.01) |
| *H01L 21/48* | (2006.01) |
| *H01L 23/12* | (2006.01) |
| *H01L 23/498* | (2006.01) |
| *H01L 21/66* | (2006.01) |

(52) U.S. Cl.
CPC .............. *H01L 24/85* (2013.01); *H01L 21/481* (2013.01); *H01L 22/32* (2013.01); *H01L 23/12* (2013.01); *H01L 23/49838* (2013.01); *H01L 23/49894* (2013.01); *H01L 2224/85* (2013.01); *H01L 2924/00014* (2013.01); *H01L 2924/181* (2013.01)

(58) Field of Classification Search
CPC ................ H01L 22/32; H01L 2224/73265; H01L 2224/48247; H01L 2224/97; G01R 31/2884
See application file for complete search history.

(56) References Cited

U.S. PATENT DOCUMENTS

| | | | | | |
|---|---|---|---|---|---|
| 5,248,936 | A | * | 9/1993 | Nakata | ............... G01R 31/2884 324/73.1 |
| 5,648,661 | A | * | 7/1997 | Rostoker | ............. H01L 27/0207 257/208 |

(Continued)

FOREIGN PATENT DOCUMENTS

| | | |
|---|---|---|
| KR | 1020020070548 A | 9/2002 |
| KR | 100886716 B1 | 2/2009 |

*Primary Examiner* — John C Ingham
(74) *Attorney, Agent, or Firm* — William Parks & Associates Ltd.

(57) ABSTRACT

A method of manufacturing a semiconductor package includes: forming a strip substrate including a plurality of unit substrates, each being provided with a first connection pad and a second connection pad on a first surface of the unit substrate and each unit substrate being electrically and physically isolated from each other with the intervention of saw lines, first ground connection pads formed on the respective unit substrates, each of the first ground connection pads being electrically coupled with the first connection pad over the respective unit substrates, second ground connection pads formed on the saw line on the first surface side of the unit substrates and electrically isolated from the unit substrates, and test wiring formed on the saw line, the test wiring being electrically isolated from the unit substrates and electrically coupled with the second ground connection pads; and attaching semiconductor chips onto the respective unit substrates.

13 Claims, 16 Drawing Sheets

(56) References Cited

U.S. PATENT DOCUMENTS

| | | | | |
|---|---|---|---|---|
| 6,291,884 B1 * | 9/2001 | Glenn | ............... | H01L 23/49816 257/747 |
| 6,427,222 B1 * | 7/2002 | Shau | ............... | G01R 31/2856 438/18 |
| 7,098,524 B2 * | 8/2006 | Wu | ............... | H01L 23/585 257/620 |
| 2008/0210935 A1 * | 9/2008 | Ebara | ............... | H01L 21/78 257/48 |

* cited by examiner

SEMICONDUCTOR PACKAGE AND METHOD FOR MANUFACTURING THE SAME

CROSS-REFERENCES TO RELATED APPLICATIONS

The present application claims priority under 35 U.S.C. 119(a) to Korean patent application number 10-2013-0132044 filed on Nov. 1, 2013, in the Korean Intellectual Property Office, which is incorporated herein by reference in its entirety.

TECHNICAL FIELD

The disclosure generally relates to a semiconductor technology, and more particularly, to a semiconductor package and a method for manufacturing the same.

BACKGROUND

In general, a packaging process includes a dicing process for singulating a semiconductor chip fabricated on a wafer by cutting the wafer, a chip attaching process for attaching the singulated semiconductor chip onto a substrate, a wire bonding process for connecting bonding pads of the semiconductor chip with connection pads of the substrate, and a molding process for encapsulating the semiconductor chip with a molding member.

A strip substrate may have a plurality of unit substrates.

SUMMARY

In an embodiment, a method for manufacturing a semiconductor package may include: forming a strip substrate including a plurality of unit substrates, each being provided with a first connection pad and a second connection pad on a first surface of the unit substrate and each unit substrate being electrically and physically isolated from each other with the intervention of a saw lines, first ground connection pads may be formed on the respective unit substrates, each of the first ground connection pads may be electrically coupled with the first connection pad over the respective unit substrates, second ground connection pads may be formed on the saw line on the first surface side of the unit substrates and electrically isolated from the unit substrates, and test wiring may be formed on the saw line, the test wiring may be electrically isolated from the unit substrates and electrically coupled with the second ground connection pads; and attaching semiconductor chips onto the respective unit substrates; forming first conductive wires that electrically connect the first ground connection pads and the second ground connection pads; forming second conductive wires that electrically connect the first connection pads of the unit substrates and the first bonding pads of the semiconductor chips; and forming third conductive wires that electrically connect the second connection pads of the unit substrates and the second bonding pads of the semiconductor chips.

In an embodiment, a semiconductor package may include: a unit substrate formed with first and second connection pads on a first surface thereof; a first ground connection pad may be formed on the first surface of the unit substrate and electrically coupled with the first connection pad; a semiconductor chip attached onto the first surface of the unit substrate, the semiconductor chip may have a first bonding pad electrically coupled with the first connection pad and a second bonding pad electrically coupled with the second connection pad; a mold part may be formed over the first surface of the unit substrate and mold the semiconductor chip; a first conductive wire may have a first end electrically coupled with the first ground connection pad and an electrically opened second end; a second conductive wire may be formed in an inside of the mold part and electrically coupling the first connection pad and the first bonding pad; and a third conductive wire may be formed in the inside of the mold part and electrically coupling the second connection pad and the second bonding pad.

DETAILED DESCRIPTION

Hereafter, various embodiments will be described in detail with reference to the accompanying drawings.

Figure 1:
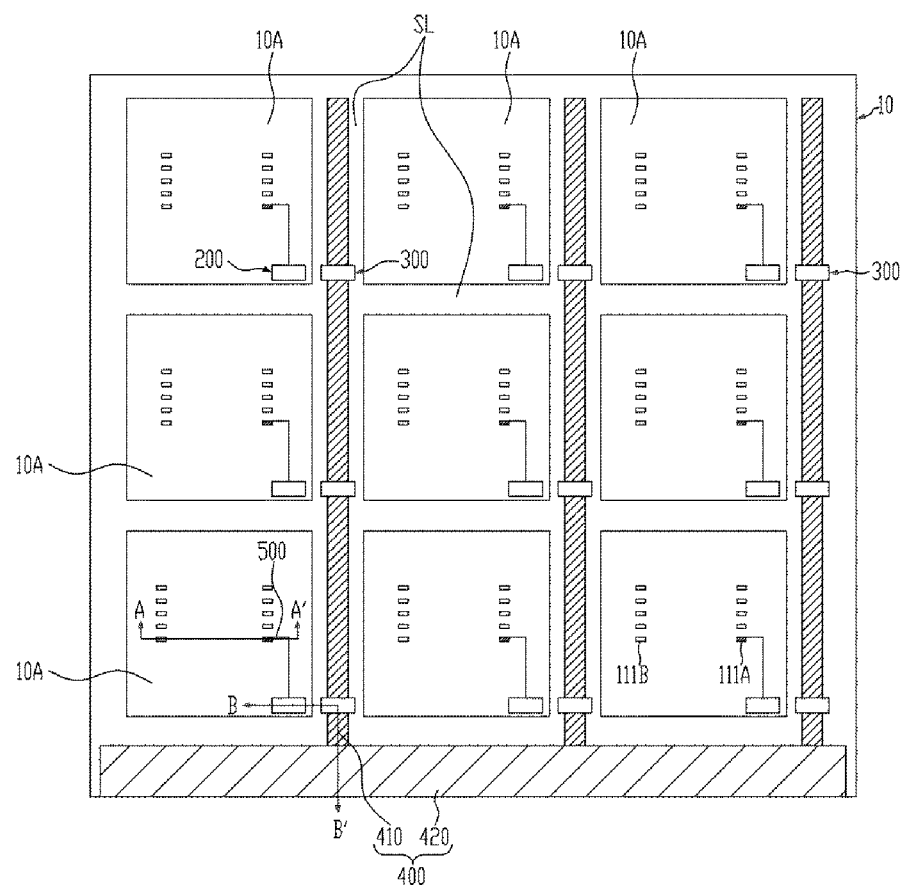
FIGS. 1 to 3 are views illustrating a strip substrate in accordance with an embodiment.
Figure 2:
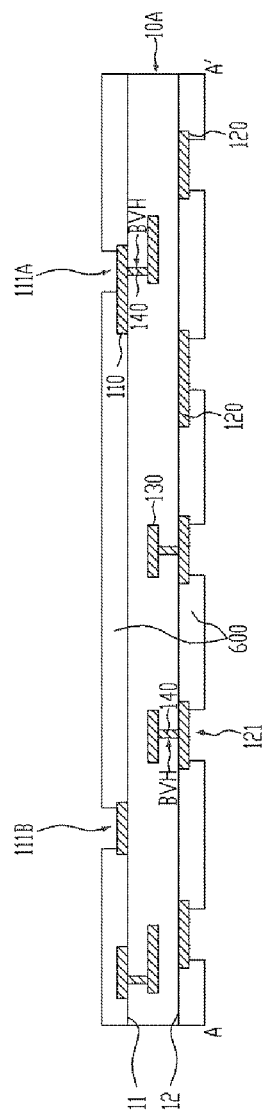
Figure 3:
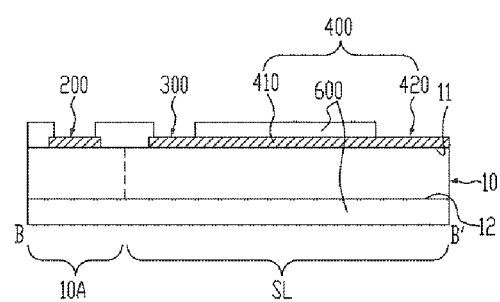

Referring to FIGS. 1 to 3, a strip substrate 10 has a first surface 11 and a second surface 12 which is opposite to the first surface 11, and may include a plurality of unit substrates 10A, first and second ground connection pads 200 and 300 and a test wiring 400. The test wiring 400 may include connection wirings 410 and a test pad 420. Here, FIG. 1 is a plan view illustrating the strip substrate 10, FIG. 2 is a cross-sectional view taken along the line A-A' in FIG. 1, and FIG. 3 is a cross-sectional view taken along the line B-B' in FIG. 1.

The unit substrates 10A may be formed such that they are spaced apart from one another with the intervention of saw lines SL. The saw line SL indicates the space between the unit substrates 10A adjacent to each other. For example, the unit substrates 10A may be arranged in a matrix shape of columns and rows with the intervention of saw lines SL. Though nine unit substrates 10A are shown and described arranged in a 3×3 matrix in an embodiment, the embodiments are not particularly limited thereto and the number of the unit substrates 10A formed over the strip substrate 10 and the shape of arrangement of the unit substrates 10A may vary.

Each of the unit substrates 10A may include circuit wirings 110, 120 and 130 which are formed in different layers from one another and conductive vias 140 that couple the circuit wirings 110, 120 and 130 formed in different layers. For example, each of the unit substrates 10A may include a first circuit wiring layer 110 formed over the first surface 11, a second circuit wiring layer 120 formed over the second surface 12 and a third circuit wiring layer 130 formed in the inside of the unit substrate 10A, and the conductive vias 140 may pass through the first surface 11 or the second surface 12 to electrically couple the first circuit wiring layer 110 with the third circuit wiring layer 130 and the second circuit wiring layer 120 with the third circuit wiring layer 130. The first circuit wiring layer 110 included in each of the unit substrates 10A may include a single first connection pad 111A and a plurality of second connection pads 111B which are to be electrically coupled with a semiconductor chip through a conductive wire, and the second circuit wiring layer 120 included in each of the unit substrates 10A may include a plurality of external electrodes 121 to which external connection terminals such as solder balls are to be attached.

The conductive via 140 may be formed by forming a blind via hole BVH that passes through the first surface 11 or the second surface 12 to expose the third circuit wiring layer 130 and filling conductive material, e.g. copper in the blind via hole BVH.

The circuit wirings 110, 120 and 130 formed in different unit substrates 10A are electrically isolated from one another such that electric fault of the conductive vias 140 may be tested by the individual unit substrate 10A. That is to say, the unit substrates 10A are electrically isolated from one another. The test for electric fault of the conductive vias 140 may be performed by flowing electric currents by the individual unit substrate 10A to check whether the electric currents flow between the first circuit wiring layer 110 formed over the first surface 11 and the second circuit wiring layer 120 formed over the second surface 12.

A single first ground connection pad 200 may be formed on the first surface 11 of each of the unit substrates 10A. The first ground connection pad 200 may be electrically coupled with the first connection pad 111A through a wiring 500. The first ground connection pad 200 and the wiring 500 may be formed along with the first circuit wiring layer 110 when forming the first circuit wiring layer 110.

Figure 4:
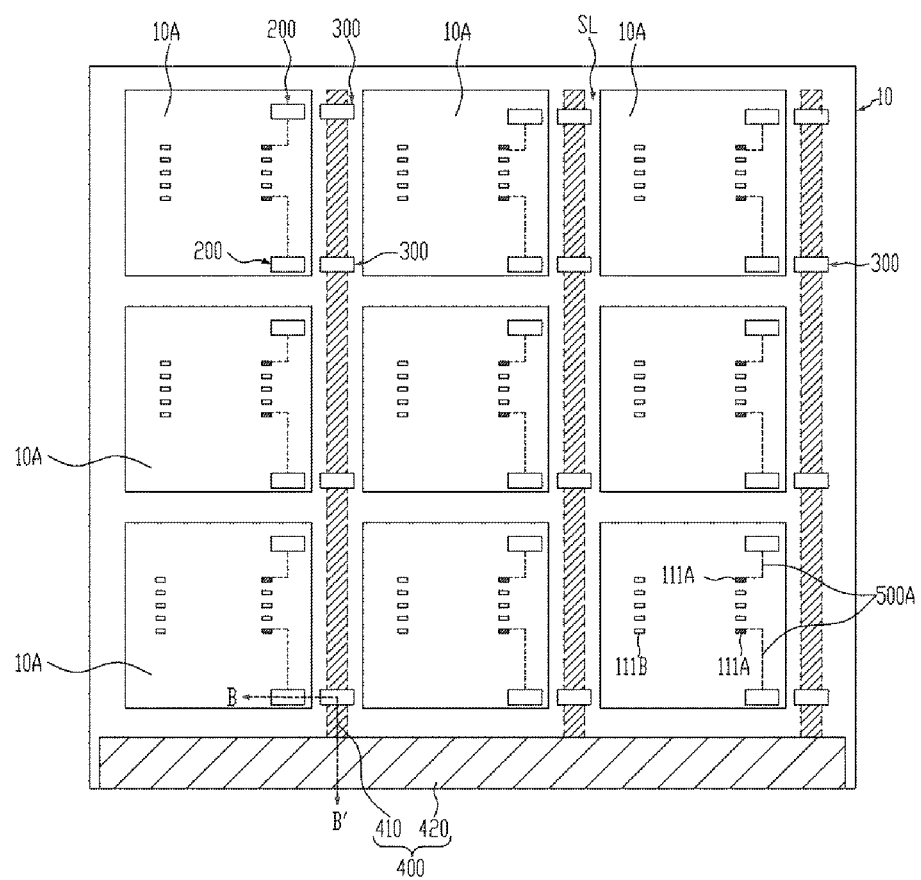
FIGS. 4 to 8 are views illustrating various forms of the strip substrate.
Figure 5:
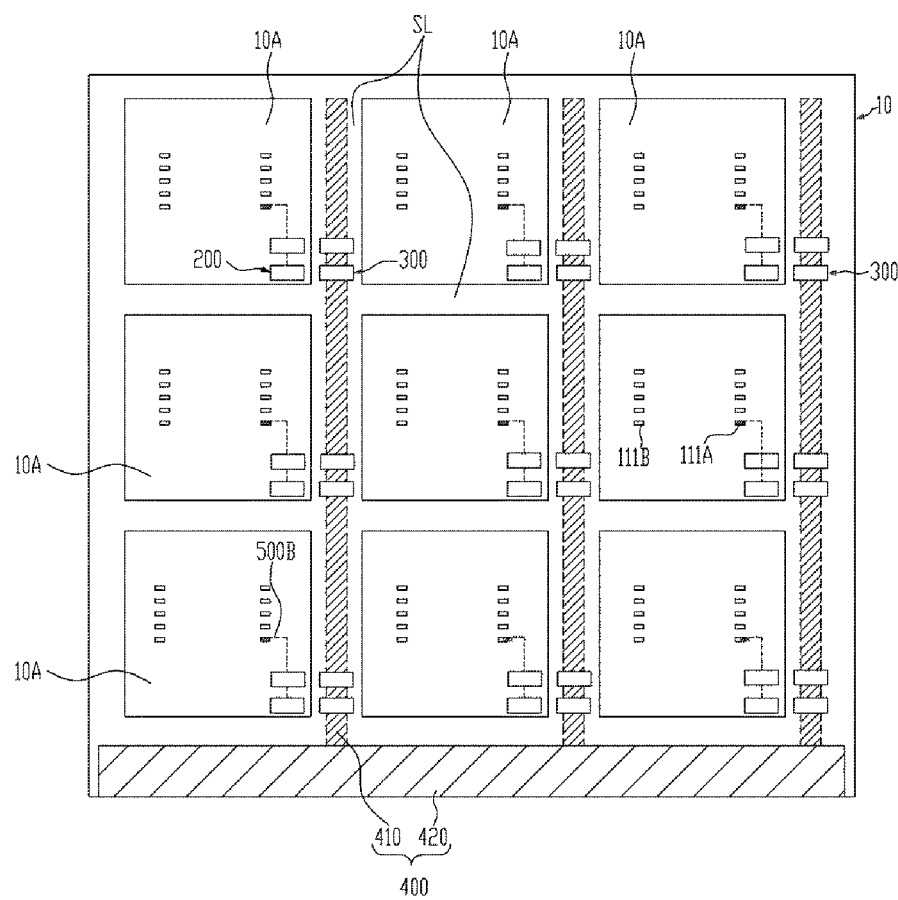

Though the embodiments shown in FIGS. 1 to 3 may be for the cases where single first connection pad 111A and single first ground connection pad 200 may be formed on each unit substrate 10A, the embodiments are not particularly limited thereto and a plurality of the first connection pads 111A and a plurality of first ground connection pads 200 may be formed over each of the unit substrates 10A. For example, as shown in FIG. 4, two first connection pads 111A and two first ground connection pads 200 may be formed on each of the unit substrates 10A. The two first connection pads 111A may correspond in a one-to-one fashion to the two first ground connection pads 200. Thus, the two first connection pads 111A may be electrically coupled to their corresponding first ground pads 200 through two separate wirings 500A, respectively. Alternatively, as shown in FIG. 5, single first connection pad 111A and two first ground connection pads 200 may be formed on each of the unit substrates 10A and the single first connection pad 111A may be electrically coupled to the two first ground pads 200 through a single wiring 500B.

Figure 6:
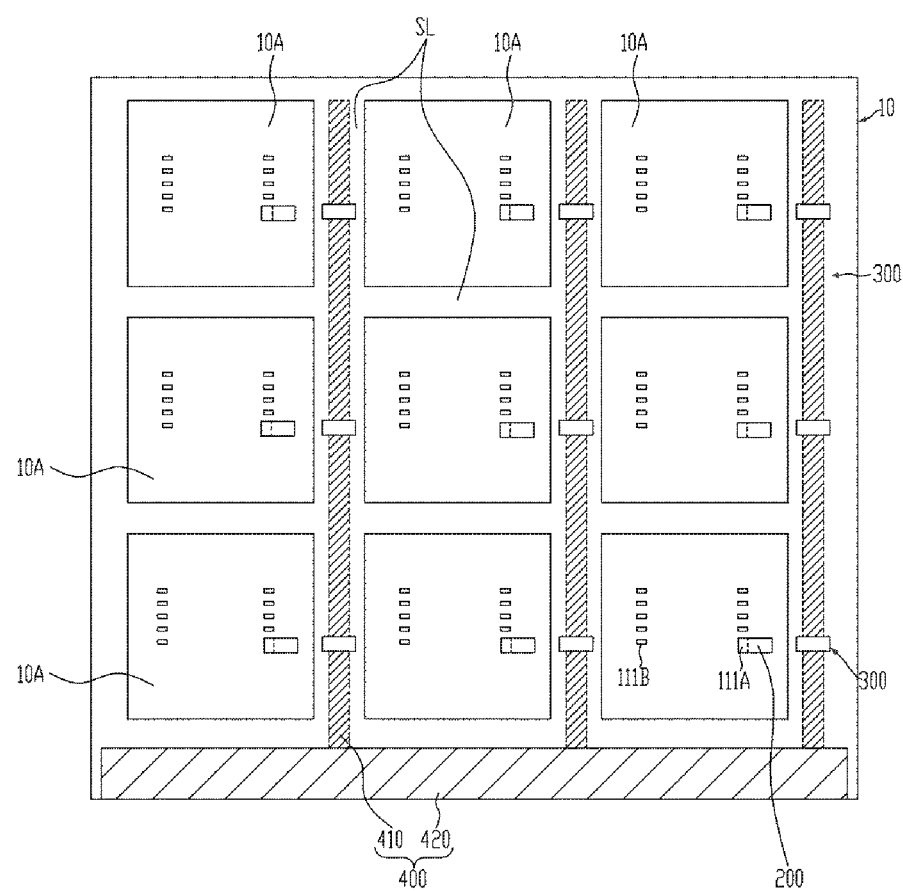

Though the embodiments of FIGS. 1 to 5 are described and shown for embodiments where the first connection pad 111A and the first ground connection pad 200 are formed separately and the first connection pad 111A and the first ground connection pad 200 are electrically coupled through the wiring 500, 500A or 500B, the embodiments are not particularly limited thereto and the first connection pad 111A and the first ground connection pad 200 may be formed integrally as shown in FIG. 6.

Referring back to FIGS. 1 and 3, the second ground connection pads 300 are formed in, over, at, or on the saw lines SL on the first surface 11 such that they correspond to the first ground connection pads 200 of the unit substrates 10A, and are electrically isolated from the unit substrates 10A. In order to minimize the length of a conductive wires which are formed in a later process for electrically coupling the second ground connection pads 300 with their corresponding first ground connection pads 200, the first ground connection pads 200 may be disposed over the edge of the unit substrate 10A and the second ground connections pad 300 may be disposed in, over, at, or on the saw line SL adjacent to their corresponding first ground connection pad 200.

The test wiring 400 may be formed in, on, or at the saw line SL, and it is electrically isolated from the unit substrates 10A but is electrically coupled with the second ground connection pads 300. The test wiring 400 may include connection wirings 410 and a test pad 420.

The connection wirings 410 may be formed along the saw lines SL and may be electrically coupled with the second ground connection pads 300. The test pad 420 may be electrically coupled with the connection wirings 410 formed over the first surface 11 of the strip substrate 10. The test pad 420 may be a mold gate pattern, which is formed over an edge of the strip substrate 10 with conductive material, e.g. copper or gold for easy removal of remaining part of a molding member upon molding process. In an embodiment, the connection wirings 410 may be formed over the first surface 11 of the strip substrate 10 and are directly connected with the second ground connection pads 300 and the test pad 420.

Figure 7:
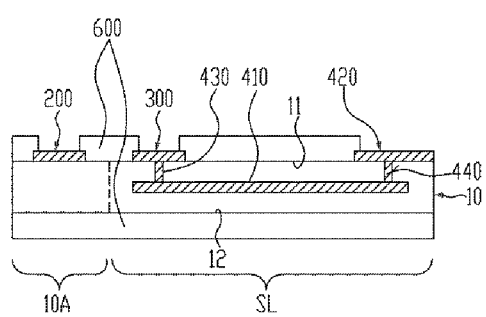
Figure 8:
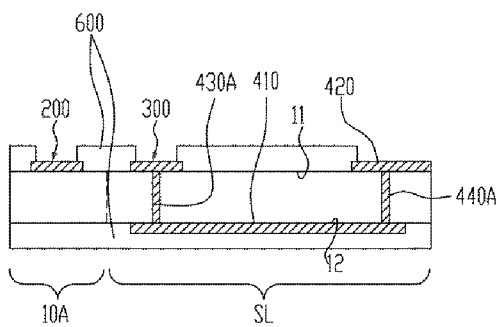

Though an embodiment is described and shown for the case where the connection wirings 410 are formed over the first surface 11 of the strip substrate 10 and directly connected with the second ground connection pads 300 and the test pad 420, the embodiments are not particularly limited thereto and may be modified to various forms. For example, as shown in FIG. 7, the connection wirings 410 may be formed in the inside of the strip substrate 10. The connection wirings 410 may be electrically coupled with the second ground connection pads 300 through first conductive vias 430 that pass through the first surface 11, and may be electrically coupled with the test pad 420 through second conductive vias 440 that pass through the first surface 11. Alternatively, as shown in FIG. 8, the connection wirings 410 may be formed over the second surface 12 of the strip substrate 10. The connection wirings 410 may be electrically coupled with the second ground connection pads 300 through third conductive vias 430A that pass through the first and second surfaces 11 and 12, and may be electrically coupled with the test pad 420 through fourth conductive vias 440A that pass through the first and second surfaces 11 and 12.

Referring back to FIGS. 2 and 3, for protecting the first and second circuit wiring layers 110 and 120 from the external environment, a passivation layer 600 that exposes the first and second connection pads 111A and 111B, the first and second ground connection pads 200 and 300, the test pad 420 and the external electrodes 121 may be formed over the first and second surface 11 and 12.

Although not shown in drawings, if the conductive vias 140 are properly formed, the first circuit wiring layer 110 and the second circuit wiring layer 120 are electrically connected through the conductive vias 140. However, if the conductive vias 140 aren't properly formed, the first circuit wiring layer 110 and the second circuit wiring layer 120 are not electrically connected through the conductive vias 140.

After the strip substrate 10 as described above is manufactured, electric fault of the conductive vias 140 may be tested by the individual unit substrate 10A (hereinafter, 'conductive via test').

The test for electric fault of the conductive vias 140 may be performed by flowing electric currents by the individual unit substrate 10A to check whether the electric currents flow between the first circuit wiring layer 110 formed over the first surface 11 and the second circuit wiring layer 120 formed over the second surface 12.

If currents are confirmed as flowing between the first circuit wiring layer 110 and the second circuit wiring layer 120, the unit substrate 10A is considered as passed the conductive via test and subsequent processes will be performed on the unit substrate 10A. On the contrary, if currents are confirmed as not flowing between the first circuit wiring layer 110 and the second circuit wiring layer 120, the unit substrate 10A is considered as not passed the conductive via test and the subsequent processes will not be performed on the unit substrate 10A. Therefore, no further processes may be performed on the unit substrate 10A that should be discarded as being poor and reduction in yields due to progress of unnecessary processes may be prevented.

Figure 9:
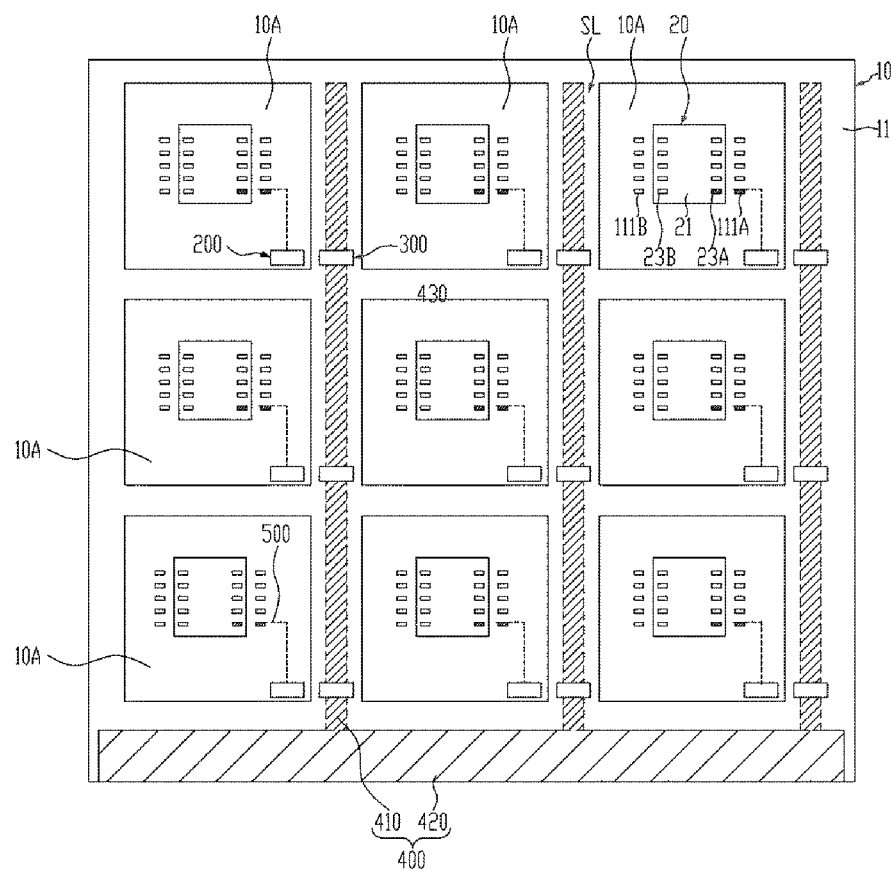
FIGS. 9 to 15 are views illustrating the process steps of manufacturing a semiconductor package in accordance with an embodiment.

Referring to FIG. 9, semiconductor chips 20 may be attached onto the individual unit substrates 10A. An embodiment is described and shown for the case where all the unit substrates 10A have passed the conductive via test. Though not shown, if there is a unit substrate 10A that has not passed the conductive via test, the semiconductor chip is not attached onto the unit substrate 10A.

Each of the semiconductor chips 20 may include a circuit unit (not shown) and first and second bonding pads 23A and 23B. The circuit unit is formed in the inside of the semiconductor chip 20, and may include a data storage unit for storing data and a data processing unit for processing data, and may include semiconductor elements required for the operation of chips, e.g. transistors, capacitors, fuses and the like. The first and second bonding pads 23A and 23B are electric contacts of the circuit unit for the electrical connection with the outside, and may be formed over the first surface 21 of the semiconductor chip 20. The first bonding pad 23A may be electrically coupled with the second bonding pad 23B through the circuit unit formed in the inside of the semiconductor chip 20. The second surface (not shown) of the semiconductor chip 20 which is opposite to the first surface 21 may be attached onto the unit substrate 10A by medium of an adhesive member 24 (refer to FIG. 10).

Figure 10:
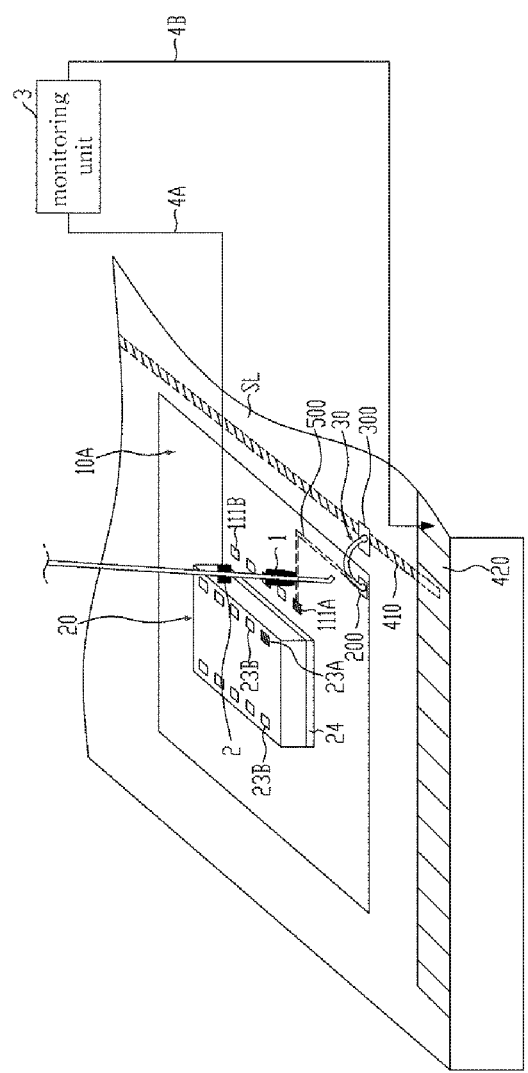

Referring to FIG. 10, a first conductive wire 30 may be formed by a wire bonding apparatus, which electrically couples the first ground connection pads 200 formed over the unit substrate 10A and the second ground connection pads 300 formed over the saw lines SL.

The wire bonding apparatus may include a capillary 1 for transferring a conductive wire to a predetermined position, a wire clamp 2 for clamping the conductive wire to cut the conductive wire, and a monitoring unit 3 for monitoring the bonding status of the conductive wire. The monitoring unit 3 may include first and second signal application lines 4A and 4B electrically coupled to the wire clamp 2 and the test pad 420, respectively, and a current providing unit (not shown) for providing current to the first signal application line 4A. The monitoring unit 3 may apply a ground voltage to the test pad 420 through the second signal application line 4B.

As the first ground connection pad 200 and the second ground connection pad 300 are electrically coupled by the first conductive wire 30, an electric path that couples the first connection pad 111A, the wiring 500, the first ground connection pad 200, the first conductive wire 30, the second ground connection pad 300, the connection wiring 410 and the test pad 420 is established.

Figure 11:
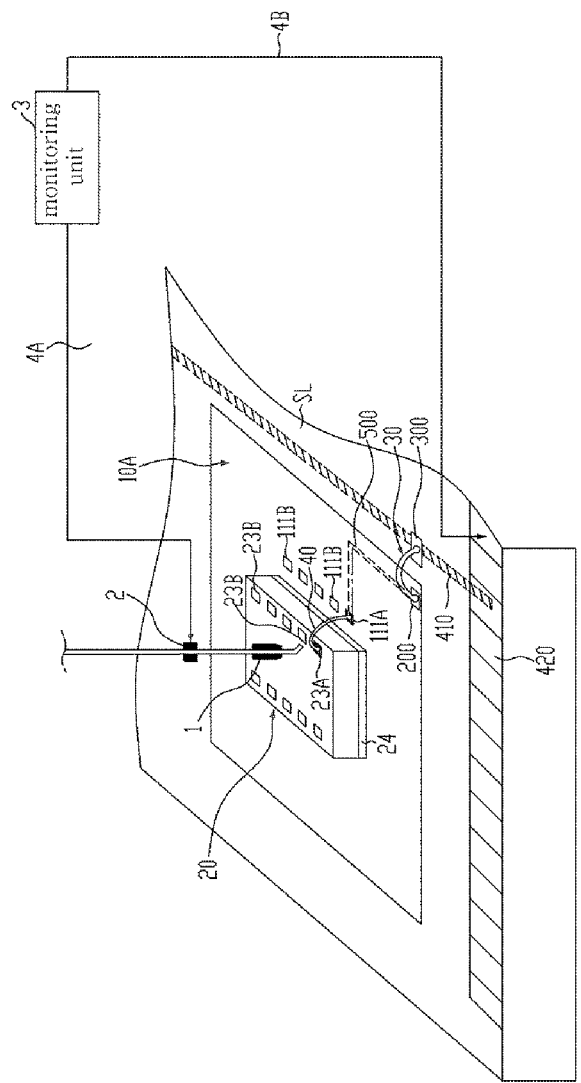

Referring to FIG. 11, a second conductive wire 40 may be formed by a wire bonding apparatus, which electrically couples the first connection pads 111A of the unit substrate 10A and the first bonding pads 23A of the semiconductor chip 20.

As described above, by electrically coupling the first ground connection pad 200 with the second ground connection pad 300 using the first conductive wire 30 and electrically coupling the first connection pad 111A with the first bonding pad 23A using the second conductive wire 40, the semiconductor chip 20 is electrically coupled with the monitoring unit 3 of the wire bonding apparatus. Therefore, during bonding the conductive wires to the second connection pads 111B of the unit substrate 10A and the second bonding pads 23B of the semiconductor chip 20, the wire bonding failure can be monitored simultaneously through the monitoring unit 3.

Hereinafter, the process steps of bonding the conductive wires to the second connection pads 111B and the second bonding pads 23B will be described with reference to FIGS. 12 to 14.

Figure 12:
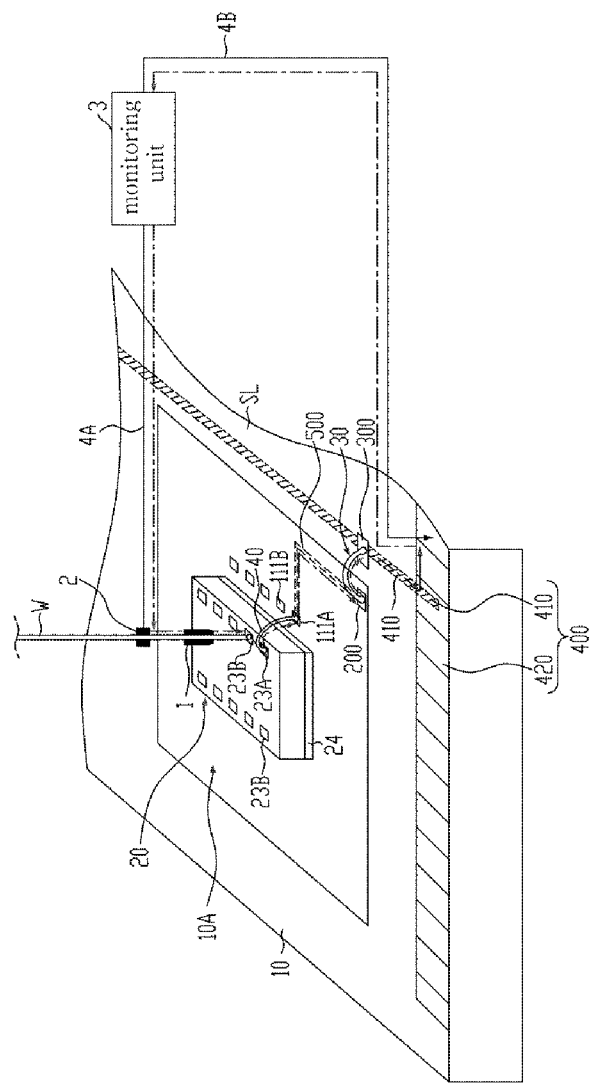

Referring to FIG. 12, in order to bond the conductive wire W to the second bonding pad 23B of the semiconductor chip 20, the capillary 1 transfers the conductive wire W to the second bonding pad 23B. Thereafter, the conductive wire W is bonded to the second bonding pad 23B.

The wire clamp 2 clamps the conductive wire W, and the monitoring unit 3 then applies a current signal generated from the current providing unit (not shown) to the first signal application line 4A for monitoring the bonding status of the conductive wire W.

If the conductive wire W is correctly bonded to the second bonding pad 23B, a closed circuit is established. The closed circuit may comprise of the monitoring unit 3, the first signal application line 4A, the wire clamp 2, the conductive wire W, the second bonding pad 23B, the circuit unit of the semiconductor chip 20, the first bonding pad 23A, the second conductive wire 40, the first connection pad 111A, the wiring 500, the first ground connection pad 200, the first conductive wire 30, the second ground connection pad 300, the connection wiring 410, the test pad 420 and the second signal application line 4B. Therefore, the current signal applied to the first signal application line 4A is inputted to the monitoring unit 3 via the closed circuit. When the current signal is inputted, the monitoring unit 3 determines that the bonding status of the conductive wire W has passed and then generates a control signal that instructs performing a subsequent bonding process.

On the contrary, though not shown, if the conductive wire W is not correctly bonded to the second bonding pad 23B, an open circuit is established. Therefore, the current signal applied to the first signal application line 4A is not inputted to the monitoring unit 3. When the current signal is not inputted, the monitoring unit 3 determines that the bonding of the conductive wire W has failed and then stops the subsequent bonding processes and generates an alarm.

Figure 13:
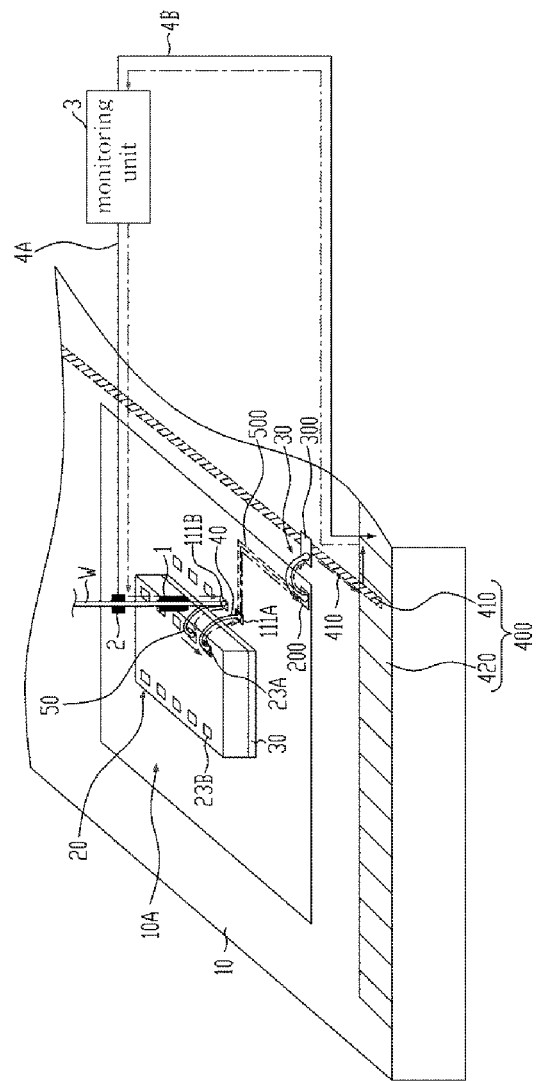

Referring to FIG. 13, after the conductive wire W is bonded to the second bonding pad 23B, the capillary 1 transfers the conductive wire W to the second connection pad 111B to bond the conductive wire W to the second connection pad 111B.

Thereafter, the wire clamp 2 clamps the conductive wire W, and the monitoring unit 3 then applies a current signal generated from the current providing unit (not shown) to the first signal application line 4A for monitoring the bonding status of the conductive wire W.

If the conductive wire W is bonded to the second connection pad 111B without being broken, a closed circuit is established. The closed circuit may comprise of the monitoring unit 3, the first signal application line 4A, the wire clamp 2, the conductive wire W, the second connection pad 111B, the third conductive wire 50, the second bonding pad 23B, the circuit unit of the semiconductor chip 20, the first bonding pad 23A, the second conductive wire 40, the first connection pad 111A, the wiring 500, the first ground connection pad 200, the first conductive wire 30, the second ground connection pad 300, the connection wiring 410, the test pad 420 and the second signal application line 4B. Therefore, the current signal applied to the first signal application line 4A is inputted to the monitoring unit 3 via the closed circuit. When the current signal is inputted, the monitoring unit 3 determines that the bonding status of the conductive wire W has passed and then generates a control signal that instructs performing of subsequent bonding process.

On the contrary, though not shown, if the conductive wire W is bonded to the second connection pad 111B with it being broken, an open circuit is established. Therefore the current signal applied to the first signal application line 4A is not inputted to the monitoring unit 3. When the current signal is not inputted, the monitoring unit 3 determines that the bonding of the conductive wire W has failed and then stops the subsequent bonding processes and generates an alarm.

Figure 14:
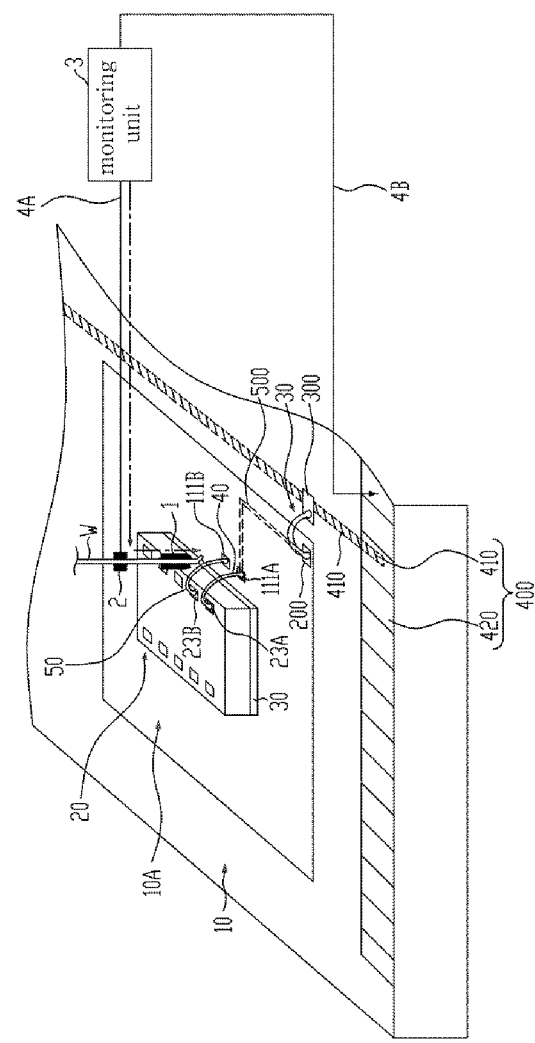
Figure 15:
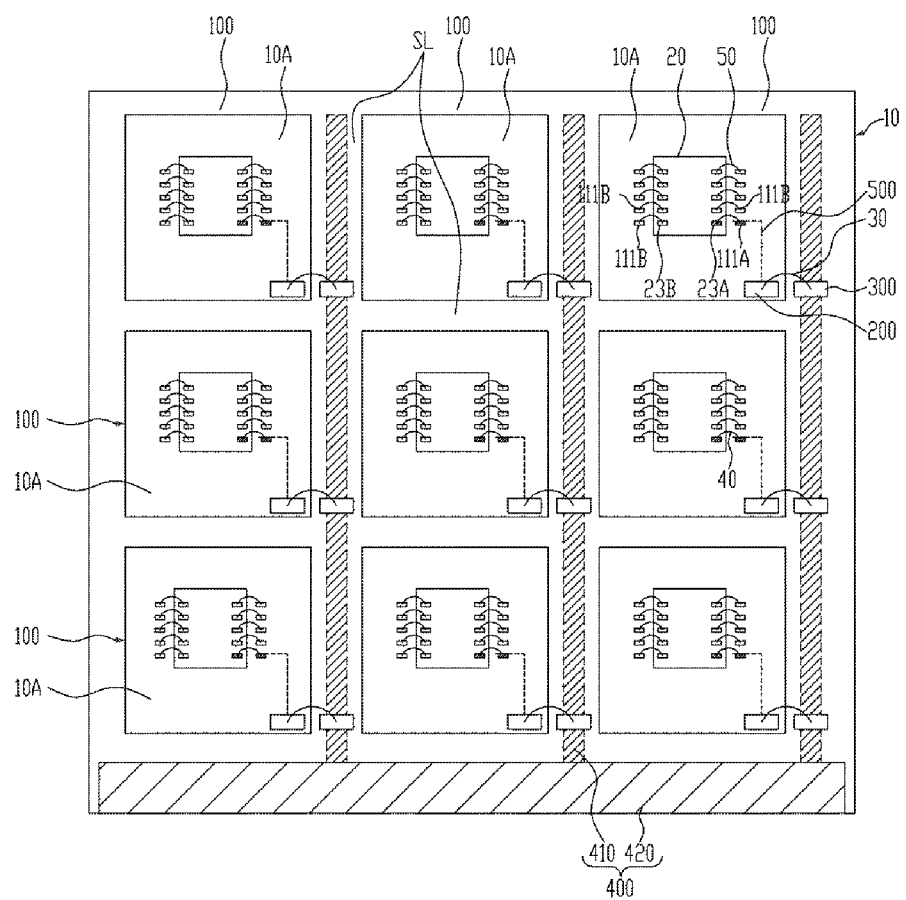
Figure 16:
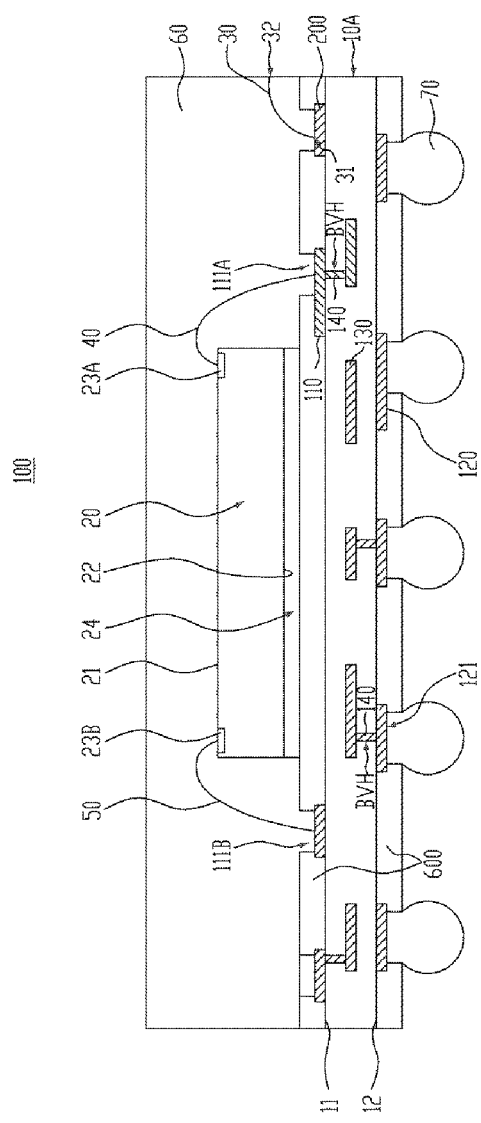
FIG. 16 is a cross-sectional view illustrating a semiconductor package in accordance with an embodiment.

Referring to FIGS. 14, 15, and 16, when the conductive wire W is confirmed as being bonded to the second connection pad 111B, the conductive wire W is cut with being clamped using the wire clamp 2. The monitoring unit 3 applies current signal generated from the current providing unit (not shown) to the first signal application line 4A for monitoring whether the conductive wire W is cut.

If the conductive wire W is cut, an open circuit is established. Therefore, the current signal applied to the first signal application line 4A is not inputted to the monitoring unit 3. When the current signal is not inputted, the monitoring unit 3 determines that the conductive wire W is cut and then generates a control signal that instructs the performing of a subsequent bonding process.

On the contrary, though not shown, if the conductive wire W is not cut, a close circuit is established. The close circuit may be comprised of the monitoring unit 3, the first signal application line 4A, the wire clamp 2, the conductive wire W, the second connection pad 111B, the third conductive wire 50, the second bonding pad 23B, the circuit unit of the semiconductor chip 20, the first bonding pad 23A, the second conductive wire 40, the first connection pad 111A, the wiring 500, the first ground connection pad 200, the first conductive wire 30, the second ground connection pad 300, the connection wiring 410, the test pad 420 and the second signal application line 4B. Therefore, the current signal applied to the first signal application line 4A is inputted to the monitoring unit 3 via the closed circuit. When the current signal is inputted, the monitoring unit 3 determines that the conductive wire W is not cut and then stops the subsequent bonding processes and generates an alarm.

The third conductive wire 50 for electrically coupling the second connection pads 111B with the second bonding pads 23B are formed in substantially the same manner as described above, thereby forming a structure as shown in FIG. 15.

Thereafter, a mold part (not shown) may be formed over the first surface 11 of the strip substrate 10. Additionally, the mold part may be formed over or around the semiconductor chips 20 and the first, second, and third conductive wires 30, 40, and 50. The external connection terminals 70 (see FIG. 16) such as solder balls may be mounted over the ball lands 121. Finally, the strip substrate 10, the first conductive wires 30 and the mold part 60 are cut along the saw lines SL, thereby manufacturing a semiconductor package 100 as shown in FIG. 16.

Referring to FIGS. 15 and 16, the semiconductor package 100 may include the unit substrates 10A, the semiconductor chips 20, the first conductive wire 30, the second conductive wire 40 and the third conductive wire 50. The semiconductor package 100 may further include the mold part 60 and the external connection terminals 70. The unit substrate 10A has the first surface 11 and the second surface 12 which is opposite to the first surface 11, and may include the first and second connection pads 111A and 111B and the first ground connection pad 200 formed over the first surface 11 and a plurality of external electrodes 121 formed over the second surface 12. The first ground connection pad 200 is electrically coupled with the first connection pad 111A through the wiring 500 (see FIG. 1).

The number of the first ground connection pad 200 formed over the unit substrate 10A may be one as shown in FIG. 1, two as shown in FIGS. 4 and 5, or though not shown, more than three. If two or more first ground connection pads 200 are provided, the unit substrate 10A may be provide with the first connection pad 111A in plural such that the first connection pads 111A correspond one-to-one to the plurality of the first ground connection pads 200. And, the plurality of wiring 500 electrically couple the first ground connection pads 200 and the corresponding first connection pads 111A, respectively. Otherwise, as shown in FIG. 5, the plurality of the first ground connection pads 200 may be electrically coupled to the single first connection pad 111A through the single wiring 500. Alternatively, as shown in FIG. 6, the first connection pad 111A and the first ground connection pad 200 may be formed integrally.

Referring back to FIG. 16, the unit substrate 10A may include circuit wirings 110, 120 and 130 which are formed in different layers from one another and the conductive vias that couple the circuit wirings 110, 120 and 130 formed in different layers. For example, the unit substrates 10A may include the first circuit wiring layer 110 formed over the first surface 11, the second circuit wiring layer 120 formed over the second surface 12 and the third circuit wiring layer 130 formed in the inside of the unit substrate 10A, and the conductive vias 140 may pass through the first surface 11 or the second surface 12 to electrically couple the first circuit wiring layer 110 and the third circuit wiring layer 130 or the second circuit wiring layer 120 and the third circuit wiring layer 130. The first circuit wiring layer 110 may include first and second connection pads 111A and 111B and the first ground connection pad 200, and the second circuit wiring layer 120 may include a plurality of external electrodes 121.

The conductive via 140 may be formed by forming a blind via hole BVH that passes through the first surface 11 or the second surface 12 to expose the third circuit wiring layer 130 and filling conductive material, e.g. copper in the blind via hole BVH.

For protecting the first and second circuit wiring layers 110 and 120 from the external environment, the passivation layer 600 that exposes the first and second connection pads 111A and 111B, the first and second ground connection pads 200 and 300, the test pad 420 and the external electrodes 121 may be formed over the first and second surface 11 and 12 including the first and second circuit wiring layers 110 and 120.

The semiconductor chip 20 may include the first surface 21 and the second surface 22 which is opposite to the first surface 21 and attached onto the unit substrate 10A by medium of the adhesive member 24, and may further include the circuit unit (not shown) and the first and second bonding pads 23A and 23B.

The circuit unit may be formed in the inside of the semiconductor chip 20. The circuit unit may include a data storage unit for storing data and a data processing unit for processing data, and may include semiconductor elements required for the operation of chips, e.g. transistors, capacitors, fuses and the like. The first and second bonding pads 23A and 23B are electric contacts of the circuit unit for the electrical connection with the outside, and may be formed over the first surface 21 of the semiconductor chip 20. The first bonding pad 23A is that corresponding to the first connection pad 111A of the unit substrate 10A, and the second bonding pad 23B is that corresponding to the second connection pad 111B of the unit substrate 10A. The first bonding pad 23A may be electrically coupled with the second bonding pad 23B through the circuit unit (not shown) formed in the inside of the semiconductor chip 20. The mold part 60 may be formed over the first surface 11 of the unit substrate 10. Additionally, the mold part 60 may be formed over or around the semiconductor chips 20 and the first, second, and third conductive wires 30, 40, and 50. The mold part 60 may include an Epoxy Mold Compound (EMC). The first conductive wire 30 has a first end 31 coupled to the first ground connection pad 200 and a second end 32 which is coupled to the first end. The second end 32 passes through the mold part 60 such that it is exposed on the side surface of the mold part 60 and is electrically open.

The second conductive wire 40 is formed in the inside of the mold part 60, and electrically couples the first connection pad 111A of the unit substrate 10A with the first bonding pad 23A of the semiconductor chip 20. The third conductive wire 50 is formed in the inside of the mold part 60, and electrically couples the second connection pad 111B of the unit substrate 10A with the second bonding pad 23B of the semiconductor chip 20.

The external connection terminal 70 may be attached onto the external electrode 121 formed over the second surface 12 of the unit substrate 10A. The external connection terminal 70 may include a solder ball.

In an embodiment, the first and second ground connection pads 200 and 300 are those electrically coupled with the test pad 420 to which a ground voltage is inputted from the monitoring unit 3 during the wire bonding process. During the wire bonding process, the ground voltage is applied to the first and second ground connection pads 200 and 300, but is not always applied to the first and second ground connection pads 200 and 300. In particular, after packaging, it should be understood that the voltage which is applied to the first ground connection pad 200 is the same or substantially the as the voltage applied to the first connection pad 111A of the unit substrate 10A.

In the embodiments, since the unit substrates over the strip substrate are electrically isolated upon fabrication of the substrate and all of the unit substrates are electrically coupled during the bonding process, it may be possible not only to test the fault of the conductive via upon the substrate fabrication but also to monitor the wire bonding failure simultaneously during the wire bonding process. Therefore, it may be possible not to perform further processes on the unit substrate on which the conductive via fault is generated by verifying the electric fault of the conductive via directly after the fabrication of the substrate, and may also be possible not to perform further processes or to perform the wire bonding again on the unit substrate on which the wire bonding is failed by monitoring the wire bonding failure monitored simultaneously during the wire bonding process, thereby enhancing yields.

The semiconductor package in accordance with various embodiments may be applied to a variety of semiconductor apparatus and package modules.

Figure 17:
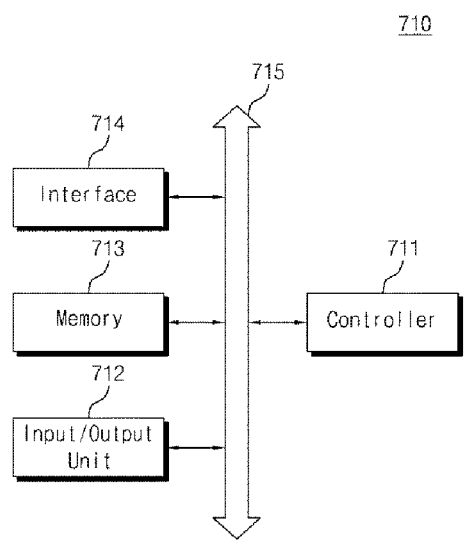
FIG. 17 is a block diagram showing an electronic system to which the semiconductor package in accordance with various embodiments is applied.

Referring to FIG. 17, the semiconductor package in accordance with various embodiments may be applied to an electronic system. The electronic system 710 may include a controller 711, an input/output unit 712, and a memory 713. The controller 711, the input/output unit 712 and the memory 713 may be coupled with one another through a bus 715, which serves as a path through which data move.

The controller 711 may include at least any one of the following: one or more microprocessors, one or more digital signal processors, one or more microcontrollers, and logic devices capable of performing the same functions as these components. The memory 713 may include the stacked package according to various embodiments. The input/output unit 712 may include at least one selected among a keypad, a keyboard, a display device, a touch screen and so forth. The memory 713 may store data and/or commands to be executed by the controller 711 and the like.

The memory 713 may include a volatile memory device and/or a nonvolatile memory device, such as a flash memory. For example, a flash memory to which the technology of the embodiments are applied may be mounted to an information processing system such as a mobile terminal or a desktop computer. The flash memory may be constituted by a solid state drive (SSD). The electronic system 710 may stably store a large amount of data in a flash memory system.

The electronic system 710 may further include an interface 714 configured to transmit and receive data to and from a communication network. The interface 714 may be a wired or wireless type. For example, the interface 714 may include an antenna or a wired (or wireless) transceiver.

The electronic system 710 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 710 is an equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 18:
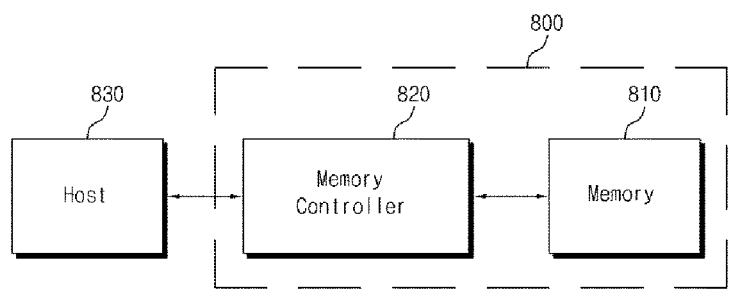
FIG. 18 is a block diagram illustrating a memory card which may include the semiconductor package in accordance with various embodiments.

Referring to FIG. 18, the semiconductor package in accordance with various embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include the stacked package in accordance with various embodiments mentioned above. The memory controller 820 may control the memory 810 such that stored data is read out or data is stored in response to a read/write request from a host 830.

While various embodiments have been used, it will be apparent to those skilled in the art that various changes and modifications may be made without departing from the spirit and scope of the application as defined in the following claims.

What is claimed is:

1. A semiconductor package, comprising:
   a unit substrate formed with first and second connection pads over a first surface thereof;
   a first ground connection pad formed over the first surface of the unit substrate and electrically coupled with the first connection pad;
   a semiconductor chip attached onto the first surface of the unit substrate, the semiconductor chip having a first bonding pad electrically coupled with the first connection pad and a second bonding pad electrically coupled with the second connection pad;
   a mold part for covering the first surface of the unit substrate including the semiconductor chip;

a first conductive wire having a first end electrically coupled with the first ground connection pad and an electrically opened second end;
a second conductive wire formed in an inside of the mold part and electrically coupling the first connection pad and the first bonding pad; and
a third conductive wire formed in the inside of the mold part and electrically coupling the second connection pad and the second bonding pad,
wherein at least two first ground connection pads are formed over the first surface of the unit substrate, the two or more first ground connection pads are electrically coupled to one first connection pad.

2. The semiconductor package of claim 1, further comprising:
a wiring for electrically coupling the first connection pad and the first ground connection pad.

3. The semiconductor package of claim 1, wherein the first connection pad and the first ground connection pad are formed integrally.

4. The semiconductor package of claim 1, wherein the unit substrate includes:
a first circuit wiring layer formed over the first surface and having the first connection pad, the second connection pad and the first ground connection pad;
a second circuit wiring layer formed over the second surface of the unit substrate which is opposite to the first surface;
a third circuit wiring layer formed in an inside of the unit substrate; and
conductive vias for electrically coupling the first circuit wiring layer with the third circuit wiring layer or the second circuit wiring layer with the third circuit wiring layer through the first surface or the second surface.

5. The semiconductor package of claim 1, wherein the first bonding pad is electrically coupled with the second bonding pad through a circuit unit formed in an inside of the semiconductor chip.

6. The semiconductor package of claim 1, wherein the second end of the second conductive wire passes through the mold part to be exposed to the side surface of the mold part.

7. An electronic system including a controller, an interface, an input/output unit, and a memory device coupled with one another through a bus, the memory device including a semiconductor package comprising:
a unit substrate formed with first and second connection pads over a first surface thereof;
a first ground connection pad formed over the first surface of the unit substrate and electrically coupled with the first connection pad;
a semiconductor chip attached onto the first surface of the unit substrate, the semiconductor chip having a first bonding pad electrically coupled with the first connection pad and a second bonding pad electrically coupled with the second connection pad;
a mold part for covering the first surface of the unit substrate including the semiconductor chip;
a first conductive wire having a first end electrically coupled with the first ground connection pad and an electrically opened second end;
a second conductive wire formed in an inside of the mold part and electrically coupling the first connection pad and the first bonding pad; and
a third conductive wire formed in the inside of the mold part and electrically coupling the second connection pad and the second bonding pad,
wherein at least two first ground connection pads are formed over the first surface of the unit substrate, the two or more first ground connection pads are electrically coupled to one first connection pad.

8. A semiconductor package, comprising:
a unit substrate formed with first and second connection pads over a first surface thereof;
a first ground connection pad formed over the first surface of the unit substrate and electrically coupled with the first connection pad;
a semiconductor chip attached onto the first surface of the unit substrate, the semiconductor chip having a first bonding pad electrically coupled with the first connection pad and a second bonding pad electrically coupled with the second connection pad;
a mold part for covering the first surface of the unit substrate including the semiconductor chip;
a first conductive wire having a first end electrically coupled with the first ground connection pad and an electrically opened second end;
a second conductive wire formed in an inside of the mold part and electrically coupling the first connection pad and the first bonding pad; and
a third conductive wire formed in the inside of the mold part and electrically coupling the second connection pad and the second bonding pad,
wherein at least two first ground connection pads are formed over the first surface of the unit substrate,
wherein the unit substrate is provided with the first connection pad in plural such that the first connection pads correspond one-to-one to the plurality of the first ground connection pads,
wherein the first ground connection pads are electrically coupled to the corresponding first connection pads, respectively.

9. The semiconductor package of claim 8, further comprising:
a wiring for electrically coupling the first connection pad and the first ground connection pad.

10. The semiconductor package of claim 8, wherein the first connection pad and the first ground connection pad are formed integrally.

11. The semiconductor package of claim 8, wherein the unit substrate includes:
a first circuit wiring layer formed over the first surface and having the first connection pad, the second connection pad and the first ground connection pad;
a second circuit wiring layer formed over the second surface of the unit substrate which is opposite to the first surface;
a third circuit wiring layer formed in an inside of the unit substrate; and
conductive vias for electrically coupling the first circuit wiring layer with the third circuit wiring layer or the second circuit wiring layer with the third circuit wiring layer through the first surface or the second surface.

12. The semiconductor package of claim 8, wherein the first bonding pad is electrically coupled with the second bonding pad through a circuit unit formed in an inside of the semiconductor chip.

13. The semiconductor package of claim 8, wherein the second end of the second conductive wire passes through the mold part to be exposed to the side surface of the mold part.

* * * * *